| United States Patent [19] | [11] Patent Number: 5,043,226 |
| --- | --- |
| Wiedeman et al. | [45] Date of Patent: Aug. 27, 1991 |

[54] DEPOSITION OF A CONDUCTIVE AND PROTECTIVE COATING ON A METALLIC SUBSTRATE

[75] Inventors: Richard L. Wiedeman, Marlboro; Kenneth W. Mamayek, Avon; Henry B. Gordon, Shrewsbury, all of Mass.; Mohan L. Sanduja, Flushing, N.Y.; Kenneth K. Sugathan, Piscataway, N.J.; Felicia Dragnea, Forest Hills; Carl Horowitz, Brooklyn, both of N.Y.

[73] Assignee: Digital Equipment Corporation, Maynard, Mass.

[21] Appl. No.: 341,995

[22] Filed: Apr. 24, 1989

[51] Int. Cl.⁵ .................... B32B 15/08; B32B 27/00
[52] U.S. Cl. .................... 428/461; 252/513; 427/327; 427/386; 427/388.1; 526/145; 526/320
[58] Field of Search ............ 252/513, 519; 427/327, 427/386, 388.1; 428/457, 461; 526/145, 320

[56] References Cited

U.S. PATENT DOCUMENTS

| 3,698,931 | 10/1972 | Horowitz | 117/47 R |
| 4,105,811 | 8/1978 | Horowitz et al. | 427/302 |
| 4,106,955 | 8/1978 | Horowitz et al. | 427/386 X |
| 4,747,966 | 5/1988 | Maeno et al. | 252/513 X |
| 4,776,979 | 10/1988 | Kageyama | 252/513 X |

Primary Examiner—Michael Lusignan
Attorney, Agent, or Firm—Finnegan, Henderson, Farabow, Garrett, and Dunner

[57] ABSTRACT

A method of grafting a conductive, tenacious, and protective coating on a metallic substrate. The metallic substrate, such as steel, aluminum, iron, platinum, silver, nickel, gold, cobalt, copper, copper alloys, or combinations thereof, is contacted with a composition having: (i) one or more polymerizable monomers having at least two functionalities; (ii) one or more graft initiators containing nickel ion in an amount effective to initiate the graft polymerization of the monomers; and (iii) a reducing agent capable of reducing nickel ion to nickel metal. The composition and substrate are heated for a time and at a temperature effective to graft polymerize the monomers and nickel metal onto the substrate and form a conductive, tenacious, and protective coating bonded to the substrate. The coating can also contain elemental phosphorous. Preferably, the coated substrate has a surface resistivity of less than 0.1 ohm per square. The method, coated substrate, and composition are useful for improving the electro-magnetic compatibility (EMC) and electro-static discharge (ESD) protection of electrical enclosures.

42 Claims, No Drawings

DEPOSITION OF A CONDUCTIVE AND PROTECTIVE COATING ON A METALLIC SUBSTRATE

BACKGROUND OF THE INVENTION

The present invention relates to a conductive, tenacious and protective coating for a metallic substrate, such as steel, aluminum, iron, platinum, silver, nickel, gold, cobalt, copper or copper alloys and zinc. More particularly, the present invention relates to a method of grafting a conductive and protective coating containing nickel on a metallic substrate, such as steel and aluminum, to form a coating that not only protects the substrate but also provides minimal electrical resistance. The present invention also relates to a composition for graft polymerizing a conductive, tenacious, and protective coating on a metallic substrate and to a metallic substrate coated with a conductive, tenacious, and protective coating.

In the computer and electronics industry, metallic portions of an apparatus or equipment require protection against corrosion. Any corrosion protection, however, should not diminish the electrical conductivity of the metal. Such protection should also be sufficiently durable so that it is not readily removed from the metal as the metal undergoes abrasion and exposure to the environment during routine use.

Providing Electro-Magnetic Interference (EMI) shielding for computers and other electronic devices in order to comply with both regulatory and functional requirements often requires the designers to provide a highly conductive enclosure that completely surrounds the device to the maximum extent possible and with the lowest surface resistivity (Rs) possible. This concept is often referred to as creating a 'Faraday Cage' around the product and is highly effective in containing electromagnetic fields and also in preventing their entry In addition to providing a low resistance for electromagnetic interference (EMI) currents, the enclosures must also meet electro-static discharge (ESD) requirements where similarly low surface resistivities must be achieved. Since these enclosures may be exposed to environmental conditions such as a relative humidity of 75-80%, a temperature exceeding 100° C., chlorine, hydrogen sulfide, nitrous oxide, and oxidation, the metal portions of the enclosures need to be protected so that the metal does not corrode.

In order to accomplish these objectives, the mating surfaces of the metal parts used to create the enclosure must be joined in a manner to minimize electrical resistance across the joints. For EMI purposes, conductive gaskets, spring fingers, and other appliances are commonly used in these areas to provide maximum contact area between the mating pieces with the minimum use of fasteners. It is in these areas, particularly, that the metal surfaces be corrosion resistant, tenacious, and have the lowest possible surface resistivity. It is also desirable to minimize galvanic corrosion that can occur when dissimilar metals come into contact. It is generally accepted that surface resistivities of 0.1 ohm/square or less are necessary to maintain the shielding effectiveness required for these applications.

It is, of course, equally critical to have low surface resistivities where metal to metal seams and overlaps occur without gasketing.

Presently, many different types of surface treatments are used in an effort to achieve the necessary requirements mentioned above. These include conductive paints, yellow and clear chromate coatings and precious and non-precious metal platings. Each of these methods have cost and/or performance deficiencies. Surface resistivity, stability and adhesion are all problems with the paints. The yellow and clear zinc chromates are easily displaced and are basically non-conductive; thus, they rely on being displaced to provide conduction to the metal substrate. This, in turn, creates an unprotected void on the metal surface which can subsequently corrode. The metal platings are generally expensive and, in some cases, are not tenacious enough for the abrasion environment encountered in these products.

Zinc chromates are coatings that are used for protecting metal surfaces and are not inherently conductive. Placing chromate coated sub-assemblies together to build an enclosure does not guarantee electrical conductivity between subassemblies due to the non-conductive property of the zinc chromate. The uncertainty of electrical conductivity between the outer subassemblies in an enclosure makes the enclosure less than ideal for EMI shielding and ESD protection.

For example, spring contacts, sometimes called finger-stock, attached to an enclosure, bulkhead or subassembly, are intended to make electrical contact with mating parts of the enclosure or bulkhead or subassembly in order to create an electrically continuous shield. Zinc chromate coatings are easily displaced and spread to allow the spring contact to make contact with the metal substrate, thus making electrical contact with the metal substrate. As the zinc chromate coating is displaced to allow electrical contact, the metal substrate becomes exposed to the environment and subsequently corrodes.

In addition to high cost, the metal platings are also subject to wear, vibration, and handling problems. As these coatings are applied at minimal thicknesses to minimize cost and are physically rather than chemically bonded to the substrate materials, these are susceptible to removal by 'normal' abrasion when used with working gaskets and spring contacts. These platings are also susceptible to galvanic corrosion when contacting dissimilar metal surfaces. There is also a phenomena known as 'fretting corrosion' which occurs with minimal mating pressures and is associated with metal migration/loss across the boundary area. In these cases, base metal corrosion occurs and environmental protection is lost. Also, in some instances, aesthetics are impacted due to surface contamination and discoloration. Therefore the tenacity of these coatings is not sufficient for electro-magnetic compatibility (EMC) requirements of enclosures.

These bulkheads may form a physical barrier that prevents operator access. Spring contacts attached to one bulkhead make contact with the adjacent bulkhead. When grounded, this results in an effective electrical shield. If the bulkheads are not coated to prevent corrosion, the reliability of these contacts is dramatically reduced and the customer's satisfaction with the product is adversely affected. However, as noted, any corrosion protection should not diminish the conductivity of the bulkheads.

Even when the metallic parts are coated with expensive, conductive organic paints, the coatings tend to be permeable to various corrosive gases so that the requisite degree of corrosion protection is not obtained. Because these paints typically adhere to the substrate through only physical bonds, they can be readily dislodged from the substrate over a short period of time as moisture, oxygen, chlorine, hydrogen sulfide and other corrosive gases permeate beneath the coated film.

Thus, there is a need for a coating that not only protects the metal from corrosion but also is conductive and durable. For some computer and electronic applications, a surface resistivity of less than 0.1 ohm per square is preferred on the coated metal. Of course, it is also preferred that the selected protective, tenacious and conductive coating also be relatively inexpensive and easy to apply.

SUMMARY OF THE INVENTION

The present invention can overcome these problems in the art. Specifically, the present invention can meet the advantages of providing a coating that not only protects the metallic substrate from corrosion, but that also is conductive, tenacious and durable. Indeed, the present invention can coat the metallic substrate with a composition to result in the coated metal having a surface resistivity of less than 0.1 ohm per square. The method of applying the coating of the present invention can also be relatively easy and inexpensive to carry out.

To overcome the problems in the art and achieve the above-described advantages of the present invention, the invention, as embodied and broadly described herein, provides a method of grafting a conductive, tenacious and protective coating on a metallic substrate, particularly a metallic substrate of steel, aluminum, iron, platinum, silver, nickel, gold, cobalt, copper or copper alloy. In the method, the metallic substrate is contacted with a composition that comprises: (i) one or more polymerizable monomers having at least two functionalities; (ii) one or more graft initiators containing nickel ion in an amount effective to initiate the graft polymerization of the monomers; and (iii) a reducing agent capable of reducing nickel ion to nickel metal. The composition and substrate are heated for a time and at a temperature effective to graft polymerize the monomers and nickel metal onto the substrate and form a conductive, tenacious, and protective coating bonded to the substrate. It is believed that the bond is covalent.

The present invention also provides a composition for graft polymerizing a conductive, tenacious, and protective coating. The composition comprises: (i) one or more polymerizable monomers having at least two functionalities; (ii) one or more graft initiators containing nickel ions in an amount effective to initiate the grafting of the monomers onto the substrate; and (iii) a reducing agent capable of reducing nickel ion to nickel metal.

The present invention further provides a metallic substrate coated with a conductive, tenacious, and protective coating. This coating comprises: (a) a metallic substrate; and (b) a conductive, tenacious, and protective coating graft polymerized to the substrate. Preferably, the coating comprises: (i) one or more polymerized monomers having at least two functional groups, and (ii) nickel metal. The coated substrate has a surface resistivity of less than 0.1 ohm per square. The coating also preferably includes elemental phosphorous.

The protective, tenacious, and conductive coating of the present invention is believed to be graft bonded or chemically bonded to the substrate. Such a bonding is distinguishable from mere physical bonding.

Preferably, the resulting coated substrate has a surface resistivity of less than 0.1 ohm per square. Such a relatively low resistivity enables the coated substrate to be used in numerous applications in the computer and electronics industries, such as coatings on enclosures and subassemblies of a computer system. The present invention can solve the previous problem of providing a conductive, tenacious, and protective coating to the enclosures and subassemblies of a computer system.

The monomer in the coating is preferably a vinyl monomer having functionalities selected from the group consisting of hydroxyl, carboxyl, epoxy, amide, and amine anhydride functional groups. The reducing agent preferably contains elemental phosphorous in the form of, for example, sodium hypophosphite, that can also become part of the coating on the substrate. Preferably, the coating is about 5 to about 50 micrometers thick.

The present invention can further include the step of cleaning the substrate prior to contacting the substrate with the composition. For example, the substrate can be cleaned by contacting the substrate with a solvent, such as a polar and/or nonpolar solvent, under the application of sonication.

The method of coating a metal substrate with a protective, tenacious, and conductive coating can overcome the problems in the art. The method results in a coating on the metal substrate, such as steel, aluminum, iron, platinum, silver, nickel, gold, cobalt, copper or copper alloys that is protective of the metal, tenacious and conductive. The coated metal can be exposed to environmental conditions, such as relatively high moisture, high temperature, chlorine, nitrous oxide, and hydrogen sulfide, without substantial undesirable corrosion of the metal occurring. The coated metal can also be exposed to scratch and abrasion conditions without adversely affecting the operability of the coating. The coated substrate can also provide a surface resistivity of less than 0.1 ohm per square. Beside being protective of the metal and forming a tenacious and electrically conductive coated metal substrate, the coating of the present invention is relatively economical and easy to apply to the metal substrate.

Without being bound by theory, it is believed that the nickel ion activates the metal substrate for the in situ graft polymerization of the monomers onto the substrate. The nickel metal is believed to provide the desired degree of conductivity to the coated substrate. Since the coating is graft bonded to the substrate, as opposed to the physical bonding that occurs when the substrate is painted, the coating is less likely to be abraded or removed from the substrate.

These and other objects, features, and advantages of the present invention will be made more apparent from the following description of the preferred embodiments.

DETAILED DESCRIPTION OF THE PREFERRED EMBODIMENTS

Reference will now be made in detail to the presently preferred embodiments of the invention.

In accordance with the present invention, a method of grafting a conductive, tenacious and protective coating on a metallic substrate is provided. The metallic substrate is contacted with a composition that comprises: (i) one or more polymerizable monomers having at least two functionalities; (ii) one or more graft initiators containing nickel ion in an amount effective to initiate the graft polymerization of the monomers; and (iii) a reducing agent capable of reducing nickel ion to nickel metal.

As used herein, the term "functionality" to describe the polymerized monomer indicates that the monomer has a functional group that has replaced a hydrogen atom on the monomer and through which a bond can be formed. Thus, a monomer that has two functionalities is a monomer that has two functional groups that have replaced two hydrogen atoms in the monomer and that allow the monomer to form two bonds through the two functional groups.

In one embodiment, the polymerizable monomer is a vinyl monomer preferably having functionalities selected from the group consisting of hydroxyl, carboxyl, epoxy, amide, and amine anhydride functional groups. For example, the monomer can be hydroxyethyl acrylate, hydroxypropyl acrylate, or combinations thereof.

The monomer is preferably present in the composition in a concentration within the range of about 0.1 to about 1 parts by weight. Sufficient monomer should be present in the composition to bond to those portions of the substrate that have been activated or initiated for graft polymerization thereon.

In a preferred embodiment, the nickel ion is present in the composition as a nickel salt. For example, nickel salts such as nickel sulfate hexahydrate, nickel acetate tetrahydrate, nickel chloride and nickel sulfate can be used. The nickel ion is preferably present in the composition in a concentration within the range of about 20 to about 35 parts by weight.

The reducing agent is selected to reduce the nickel ion in the composition to nickel metal. Preferably, the reducing agent contains phosphorous, which can also then become part of the coating as elemental phosphorous. An effective reducing agent for use in the present invention is sodium hypophosphite. The reducing agent should be present in the composition in an amount sufficient to reduce enough nickel ion present in the composition so that the concentration of nickel metal in the coating achieves the desired degree of conductivity, tenacity, and protection. The composition can also contain an oxidizing agent to regenerate nickel ion from nickel metal that is not graft polymerized onto the substrate. A peroxide is an example of such an oxidizing agent. The composition containing the monomers, nickel ion, and reducing agent is typically present in a solution having water as the solvent. Preferably, deionized water is used. The pH of the solution is preferably maintained in the range of about 6 to about 7 with a buffer system. For example, the buffer system can be a mixture of sodium acetate anhydrous, glacial acetic acid, and concentrated ammonia.

In accordance with the present invention, the metallic substrate and the composition are heated for a time and at a temperature effective to graft polymerize the monomers and nickel metal onto the substrate and form a conductive, tenacious, and protective coating covalently bonded to the metallic substrate. For example, the metallic substrate and composition can be heated to a temperature within the range of about 80° C. to about 90° C. for a time within the range of about 10 mins. to about 150 mins. In part, the thickness of the resulting coating will depend upon the time and temperature selected.

In one embodiment of the present invention, after the substrate and composition are heated to form a coating on the substrate, the coated substrate is heated at a temperature and for a time sufficient to cure the coating onto the substrate. For example, the coated substrate is separated from the unreacted composition and rinsed with a solvent, such as water. The coated substrate is cured either by leaving it at ambient temperature for about 24 hours or heating up to about 200° C. for up to about 120 minutes to improve the coating performance.

In another embodiment of the present invention, prior to contacting the metal substrate with the composition, the substrate is cleaned. For example, the substrate can be cleaned by contacting the substrate with a solvent under the application of sonication. Preferably, the substrate is cleaned by contacting the substrate separately with a polar solvent and a nonpolar solvent under the application of sonication. An example of a suitable polar solvent is a soapy water detergent and an example of a suitable nonpolar solvent is a chlorofluorohydrocarbon sold under the trademark FREON by E. I. Du Pont de Nemours & Co. Typically, the substrate is cleaned in the solvents for a time of about 10 mins. to about 15 mins. at a temperature of about 40° C. to about 90 ° C. It is believed that this cleaning permits better bonding of the coating to the substrate.

For example, the substrate can be cleaned by immersing the substrate in a cleaning solvent, such as a chlorofluorohydrocarbon and sonicated for 15 minutes. The substrate is then removed and air dried. Typically, within two hours of removal, the substrate is contacted with the composition of the present invention.

The composition of the present invention is effective in providing a conductive, tenacious, and protective coating on a metallic substrate. The composition is especially suited for metals selected from steel, aluminum, and combinations thereof, although the coating may be effective on other metals, such as iron, platinum, silver, nickel, gold, cobalt, copper, copper alloys and combinations thereof.

In accordance with the present invention, the conductive, tenacious, and protective coating is graft polymerized bonded on the metallic substrate. The coating comprises: (i) one or more polymerized monomers having at least two functionalities; and (ii) nickel metal. The coating preferably contains elemental phosphorous, especially when a phosphorus containing reducing agent is used. It is expected that the coating can also include other additives, such as colorants, pigments, and visible fluorescent dyes, so long as the conductivity, tenacity and protective qualities of the coating are not adversely affected.

The coating on the substrate can be of varying thickness depending upon the use of the substrate. Preferably, especially in the electronic and computer fields, the coating is about 5 to about 50 micrometers in thickness. Most preferably, especially for applications to metallic substrates in these fields, the nickel metal is present in the coating in an amount effective to result in the coated metallic substrate having a surface resistivity of less than 0.1 ohm per square.

Without being bound by theory, it is believed that the substrate is coated by the composition in a graft polymerization reaction or mechanism. The coating is thus chemically bonded to the substrate, as opposed to physical bonding. The coating of the substrate with the monomers is initiated by the graft initiator of nickel ions, which removes one or more electrons from various sites on the metal substrate so as to activate the substrate for graft polymerization.

It is believed that the nickel ion is then reduced to the metallic state by the reducing agent, such as sodium hypophosphite. This reduction is believed to be nucleated by the metallic nickel atoms that are present and tightly bound in the interstices of the grafted monomer chains of the coating. The metallic nickel nucleated on the nickel atoms further autocatalyzes the reduction of the nickel ions from the nickel monomer solution to form a coating on the metallic substrate. When elemental phosphorous is also present in the coating, it is believed to be bound in the interstices of the grafted monomer chains of the coating.

Without being bound by theory, it is believed that the embodiment using the formulations of the examples, the following graft polymerization reaction mechanism occurs.

$$2MOH + Ni^{++} \rightarrow 2MO^{\cdot} - Ni - 2H^{-} \quad (1)$$

Metal substrate  Graft Initiator $$MO^{\cdot} + n(CH_2=CHX) \rightarrow MO-(CH_2-CHX)_{\overline{n-1}}CH_2-\overset{\cdot}{C}HX \quad (2)$$
monomer
METAL GRAFT POLYMER RADICAL $$2ROOH + Ni \rightarrow 2RO^{\cdot} + 2OH^{-} + Ni^{++} \quad (3)$$
Peroxide    Regeneration of Nickel ions
(GRAFT INITIATOR)

$$RO^{\cdot} + m(CH_2=CHX) \rightarrow RO-(CH_2-CHX)_{m-1}CH_2-\overset{\cdot}{C}HX \quad (4)$$
Homopolymer Radical $$MO-(CH_2-CHX)_{\overline{n-1}}CH_2-\overset{\cdot}{C}HX + RO-(CH_2-CHX)_{\overline{m-1}}CH_2-\overset{\cdot}{C}HX \quad (5)$$

$$MO-(CH_2-CHX)_{\overline{n+m}}Or$$
GRAFT polymer $$MO-(CH_2-CHX)_{\overline{n+m}}OR + (n+m)Ni \rightarrow MO-(CH_2-CHX-Ni)_{\overline{n+m}}OR \quad (6)$$
The nickel atoms are held by the side groups to the grafted polymer.

Using sodium hypophosphite as the reducing agent, the reaction of the present invention by which nickel is produced is believed to be:

$$NiSO_4 + NaH_2PO_2 + H_2O \rightarrow Ni + H_2SO_4 + NaH_2PO_3$$

$$Ni^{++} + H_2PO_2^{-} + H_2O \rightarrow Ni + 2H^{+} + H_2PO_3^{-}$$

$$p(n+m)Ni^{++} + p(n+m)H_2PO_2^{-} + p(n+m)H_2O \rightarrow \quad (7)$$

$$p(n+m)Ni + 2p(n+m)H^{+} + p(n+m)H_2PO_3^{-}$$

$$MO-(CH_2-CHX-Ni)_{\overline{n+m}}OR + p(n+m)Ni \rightarrow \quad (8)$$

$$MO-(CH_2-CHX-Ni(Ni)_p)_{\overline{n+m}}OR$$

Reaction (1) provides a radical site on the metal substrate by the reduction of nickel ion and oxidation of the substrate.

Reaction (2) illustrates the grafting of an exemplary vinyl monomer to the metallic substrate at the oxidized site to form a metal graft-polymer radical on the substrate.

Reaction (3) illustrates the regeneration of nickel ion (graft initiator) by the presence of peroxide in the monomer solution.

Reaction (4) shows the formation of a homopolymer radical, a reaction of vinyl monomer with the peroxide radical.

Reaction (5) illustrates the combination of a substrate with its grafted polymer radical combining with the peroxide homopolymer radical to form a grafted polymerized coating on the substrate.

Reaction (6) illustrates the metallic nickel combining with the graft-polymer layer. The nickel atoms are held by the side groups of the grafted layer.

Reactions (7) and (8) illustrates the deposition of nickel ions from nickel-monomer-hypophosphite solution to be deposited as nickel metal with the grafted coating on the substrate. The nickel atoms are believed to be held in the interstices of the grafted polymer and by the functional groups on the polymer side chain by a covalent bond.

In testing the surface resistivity of the coating, a surface resistivity probe is used and measures the resistivity at 3 pounds psi (0.021 MPa). To measure the protective qualities of the coating, Battelle Chamber, salt spray, thermal and adhesion tests can be used.

In the Battelle Chamber test, Class III, coated substrates are aged for 10 days in the chamber and then examined to determine if there is evidence of gross failure, blistering, loss of adhesion or corrosion. Preferably, there is no more than 5% corrosion evident in the substrate metal.

In the salt spray test, the coated substrates are subjected to 96 hours of a 5% salt spray in accordance with American Society for Testing Materials (ASTM) standard B 117-73. The specimens are examined for the same qualities as in the Battelle Chamber test.

The thermal qualities of the coated substrate are measured by the heat quench test described in ASTM B 571-79.

To measure the adhesion of the coating on the substrate, the surface of the specimen is scraped to expose the base metal, which is then examined at four times magnification to determine if removal has been caused by the cutting away of the adherent plate or by the lifting of a non-adherent plate. Tape is applied to the surface of the substrate with uniform pressure that is then removed in a quick motion at 90° to the surface. The finish is examined to determine if it remains unbroken after the tape is removed.

Burnishing of the coated substrate can be measured in accordance with ASTM-B571-79.

The following examples illustrate and do not limit the present invention.

EXAMPLES

In each of the following examples, Part A of the formulation was prepared by adding a precalculated amount of water and monomer to a container. The nickel salt, glacial acetic acid and other ingredients of the composition were then added. The contents were stirred to a uniform solution.

In each of the following examples, Part B of the formulation was prepared by adding a desired amount of sodium hypophosphite hydrate to a container along with an ammonia solution. The contents were stirred to a uniform solution.

Part A was then mixed with Part B in a precalculated ratio (1:1) by weight and the contents were stirred to a uniform solution. The pH of the resulting solution was adjusted to 6.0 with concentrated ammonium hydroxide solution.

The formulations were warmed to 80° to 85° C. A piece of metal substrate part was kept immersed in the solution vertically for 45–60 minutes with continuous stirring. The length of time of immersion in the solution depended on the desired thickness of the coating. The coated substrate was then taken out, rinsed with the water and subjected to curing at 177° C. for 30–45 minutes.

| | PARTS BY WEIGHT |
|---|---|
| EXAMPLE NO. 1 | |
| Part A | |
| Nickel sulfate hexahydrate | 27.00 |
| Deionized water (premix) | 305.00 |
| Hydroxyethyl acrylate (premix) | 0.50 |
| Sodium acetate anhydrous | 7.50 |
| Glacial acetic acid | 12.00 |
| | 352.50 |
| Part B | |
| Sodium hypophosphite hydrate | 18.00 |
| Deionized water | 333.50 |
| Concentrated ammonia | 1.00 |
| | 352.50 |
| EXAMPLE NO. 2 | |
| Part A | |
| Nickel sulfate hexahydrate | 25.00 |
| Deionized water (premix) | 281.50 |
| Hydroxyethyl acrylate (premix) | 0.50 |
| Trisodium citrate dihydrate | 24.70 |
| Glacial acetic acid | 11.30 |
| | 343.00 |
| Part B | |
| Sodium hypophosphite hydrate | 17.00 |
| Deionized water | 325.00 |
| Concentrated ammonia | 1.00 |
| | 343.00 |
| EXAMPLE NO. 3 | |
| Part A | |
| Nickel acetate tetrahydrate | 25.60 |
| Deionized water (premix) | 306.00 |
| Hydroxypropyl acrylate (premix) | 0.50 |
| Sodium acetate anhydrous | 8.00 |
| Glacial acetic acid | 14.00 |
| | 355.00 |
| Part B | |
| Sodium hypophosphite hydrate | 20.00 |
| Deionized water | 334.00 |
| Concentrated ammonia | 1.00 |
| | 355.00 |
| EXAMPLE NO. 4 | |
| Part A | |
| Nickel chloride | 28.00 |
| Deionized water (premix) | 364.00 |
| Hydroxyethyl acrylate (premix) | 0.50 |
| Sodium acetate anhydrous | 9.50 |
| Glacial acetic acid | 13.00 |
| | 415.00 |
| Part B | |
| Sodium hypophosphite hydrate | 18.00 |
| Deionized water | 396.00 |
| Concentrated ammonia | 1.00 |
| | 415.00 |
| EXAMPLE NO. 5 | |
| Part A | |
| Nickel chloride | 30.00 |
| Deionized water (premix) | 360.00 |
| Hydroxypropyl acrylate (premix) | 0.50 |
| Trisodium citrate dihydrate | 30.50 |
| Glacial acetic acid | 15.00 |
| | 436.00 |
| Part B | |
| Sodium hypophosphite dihydrate | 24.00 |
| Deionized water | 411.00 |
| Concentrated ammonia | 1.00 |
| | 436.00 |
| EXAMPLE NO. 6 | |
| Part A | |
| Nickel sulfate | 24.50 |
| Deionized water (premix) | 345.00 |
| Hydroxyethyl acrylate (premix) | 0.50 |
| Ammonium chloride | 40.00 |
| | 410.00 |
| Part B | |
| Sodium hypophosphite hydrate | 16.00 |
| Deionized water | 393.00 |
| Concentrated ammonia | 1.00 |
| | 410.00 |

Coated samples of steel and aluminum prepared with formulation from all of the six examples were subjected to a series of standard tests, such as adhesion, film hardness, corrosion resistance, abrasion resistance, chemical resistance, and conductance measurements. The protective coatings on these samples passed all the tests, as shown in Table I.

TABLE I

TEST RESULTS ON COATED SAMPLES OF STEEL AND ALUMINUM

| TEST PROCEDURES | RESULTS |
|---|---|
| 1. Adhesion | |
| (a) Film Adhesion | |
| 10 parallel cuts, 1/16" (1.59 mm) apart were made through the | No peeling off or removal of film was observed. |

TABLE I-continued
TEST RESULTS ON COATED SAMPLES OF STEEL AND ALUMINUM

| TEST PROCEDURES | RESULTS |
|---|---|
| film and 10 similar cuts were made at right angles (90°) to and crossing first 10 cuts. Tape (3M transparent No. 710, ¾" (19.0 mm) wide) was applied over area of cuts by pressing down firmly against coating to eliminate voids and air pockets. Then, the tape was sharply pulled off at right angle to the place of the surface being treated. | |
| (b) Wet Adhesion | |
| Made cross hatch cuts on the film surface as in case of (a) and then immersed the samples in distilled or deionized water at 38° C. for 24 hours. Removed, air dried and then repeated tape test as outlined in (a). | No blistering or removal of film under tape within or outside of cross-hatched area was observed. |
| 2. Scratch Resistance | |
| The exposed lead part of a 6H pencil, held at an angle of 45° to the film surface, was pushed forward about ⅛" (3.18 mm) using as much forward pressure as can be applied without breaking the lead. | No rupture of the film was observed. |
| 3. Abrasion Resistance via Falling Sand Method ASTM D968-51 | |
| One hundred liters of sand were made to fall on the coated surfaces of a metallic sample held at 45° angle from a height of 3-4 feet (91.4 to 121.9 cm). | No delamination of the film was observed. |
| 4. Impact Resistance | |
| ASTM D2794-74 - Applied impact load directly to coated surface, using a Gardner Variable Impact Tester (160 inch-pound range, 1.84 m-Kg range) with sufficient force (160 inch pound, 1.84 m-Kg) so as to deform the test sample. Applied tape 3M #710 over deformed area by pressing down firmly against the coating to eliminate voids and air pockets. Then sharply pulled tape off at right angle to plane of coated surface. | No cracking or peeling off of the film was observed for metallic substrate. |
| 5. Corrosion Resistance | |
| 1. ASTM B-117-73 - The test samples were placed in a 5% salt spray chamber maintained at 31° C. for 5 days. | No rusting of the samples observed. Samples passed 120 hours of salt spray test. |
| 2. Test samples were scored with a sharp knife to make deep cuts so that the base metal was exposed. Then, they were exposed to salt spray chamber at 32° C. | No blistering or undercutting of the film was observed. |
| 6. Chemical Tests | |
| Test was carried out for each coated sample. A coated sample of each was kept immersed in the following aqueous solutions for 48 hours: | |
| 1. Chlorine solution - 20 parts per billion | No adverse effect was observed. |
| 2. Nitrous oxide solution - 200 parts per billion | No adverse effect was observed. |
| 3. Hydrogen sulfide solution - 100 parts per billion | No adverse effect was observed. |
| 4. Relative humidity of 75% at 29° C. | No adverse effect was observed. |
| 7. Conductance Measurement | |
| Each coated sample was tested for conductivity. | Samples were found to be highly conductive. |
| 8. Surface Resistivity (Rs) | |
| Surface resistivity measurement. | All samples less than |

TABLE I-continued

TEST RESULTS ON COATED SAMPLES OF
STEEL AND ALUMINUM

| TEST PROCEDURES | RESULTS |
| --- | --- |
| | 0.1 ohms per square. |

Surface resistivity is a quantitative measure of the ability of a surface to conduct electricity. It is measured in units of electrical resistance (ohms) per unit of square surface area. The square area can be any convenient size as long as the surface areas measured are square and equal and the area between them are equal. This is the accepted method of measuring conductive surfaces. Regardless of the size of the square chosen, the results will be equal as long as the area of each probe and the spacing between them are equal and the surface being measured is uniform. As the method is not dependent on the absolute size of the square area chosen, units of area are excluded from the units, ohms/square.

Measurements are in units of ohms per square made with a fixture consisting of a 3 psi (0.021 MPa) spring and two square surface areas (y×y) of y distance apart. These two surface areas (probes) are of a highly conductive material such as solid copper or brass. The two square surface areas at a pressure of 3 psi (0.021 MPa) make contact with the uniform flat surface to be measured. The two square surface areas are connected to an ohmmeter from which readings are made.

It will be apparent to those skilled in the art that various modifications and variations can be made in the present invention without deviating from the scope or spirit of the invention. Thus, it is intended that the present invention covers the modifications and variations of this invention provided that these come within the scope of the following claims or their equivalents.

What is claimed is:

1. A method of grafting a conductive, tenacious, and protective coating on a metallic substrate comprising the steps of:
    (a) contacting the metallic substrate with a composition comprising:
        (i) one or more polymerizable monomers having at least two functionalities;
        (ii) one or more graft initiators containing nickel ion in an amount effective to initiate the graft polymerization of the monomers; and
        (iii) a reducing agent capable of reducing nickel ion to nickel metal; and
    (b) heating the substrate and composition for a time and at a temperature effective to graft polymerize the monomers and nickel metal onto the substrate and form a conductive, tenacious, and protective coating bonded to the substrate.

2. The method of claim 1, wherein the monomer is a vinyl monomer.

3. The method of claim 1, wherein the functionalities of the monomer are selected from the group consisting of hydroxyl, carboxyl, epoxy, amide, and amine anhydride functional groups.

4. The method of claim 1, wherein the monomer is selected from the group consisting of hydroxyethyl acrylate and hydroxypropyl acrylate.

5. The method of claim 1, wherein the nickel ion is present as a salt selected from the group consisting of nickel sulfate hexahydrate, nickel acetate tetrahydrate, nickel chloride, and nickel sulfate.

6. The method of claim 1, wherein nickel metal is present in the coating in an amount effective to result in the coated metal substrate having a surface resistivity of less than 0.1 ohm per square.

7. The method of claim 1, further comprising the step of:
    (c) curing the coated substrate at a temperature and for a time sufficient to effect the curing of the coating on the substrate.

8. The method of claim 1, wherein the reducing agent contains phosphorous.

9. The method of claim 1, further comprising the step of cleaning the substrate prior to the contacting step.

10. The method of claim 9, wherein the substrate is cleaned by contacting the substrate with a solvent under the application of sonication.

11. The method of claim 1, wherein the substrate is selected from the group consisting of steel, aluminum, iron, platinum, silver, nickel, gold, cobalt, copper, copper alloys, and combinations thereof.

12. A method of grafting a conductive, tenacious, and protective coating having a surface resistivity of less than 0.1 ohm per square on a steel or aluminum metallic substrate comprising the steps of:
    (a) cleaning the substrate by contacting the substrate with a solvent;
    (b) contacting the cleaned substrate with a composition comprising:
        (i) one or more polymerizable monomers having at least two functionalities;
        (ii) one or more graft initiators containing nickel ion in an amount effective to initiate the graft polymerization of the monomers; and
        (iii) a reducing agent capable of reducing nickel ion to nickel metal; and
    (c) heating the substrate and composition for a time and at a temperature effective to graft polymerize the monomers and nickel metal onto the substrate and form a conductive and protective coating on the metallic substrate to result in a coated metallic substrate having a surface resistivity of less than 0.1 ohm per square.

13. The method of claim 12, wherein the monomer is a vinyl monomer having functionalities selected from the group consisting of hydroxyl, carboxyl, epoxy, amide, and amine anhydride functional groups.

14. The method of claim 12, wherein the monomer is selected from the group consisting of hydroxyethyl acrylate and hydroxypropyl acrylate.

15. The method of claim 14, wherein the nickel ion is present as a salt selected from the group consisting of nickel sulfate hexahydrate, nickel acetate tetrahydrate, nickel chloride and nickel sulfate.

16. The method of claim 15, wherein the reducing agent is sodium hypophosphite.

17. The method of claim 12, wherein the substrate is cleaned by contacting the substrate with a polar solvent and a nonpolar solvent under application of sonication.

18. The method of claim 12, wherein the pH of the composition is within the range of 6 to 7.

19. The method of claim 12, wherein the metal substrate and composition are heated to a temperature within the range of about 80° C. to about 90° C. for a time within the range of about 10 mins. to about 150 mins.

20. The method of claims 19, further comprising the step of:
(e) curing the coated substrate at a temperature up to about 200° C. for up to about 120 minutes.

21. A method of grafting a conductive, tenacious, and protective coating having a surface resistivity less than 0.1 ohm per square on a steel or aluminum metallic substrate comprising the steps of:
(a) cleaning the substrate by contacting the substrate with a solvent under application of a sonication;
(b) contacting the cleaned substrate with a composition comprising:
(i) one or more polymerizable monomers selected from the group consisting of hydroxyethyl acrylate and hydroxypropyl acrylate;
(ii) nickel ion in an amount effective to initiate the graft polymerization of the monomers; and
(iii) sodium hypophosphite in an amount effective to reduce the nickel ion to nickel metal;
(c) heating the substrate and composition to a temperature within the range of about 80° C. to about 90° C. for a time within the range of about 10 mins. to about 150 mins. to graft polymerize the monomers and nickel metal onto the substrate and form a conductive and protective coating bonded to the substrate, the nickel metal being present within the coating in an amount effective to result in the surface resistivity of less than 0.1 ohm per square; and
(d) curing the coated substrate for a temperature up to about 200° C. for a time within the range of up to about 120 minutes.

22. The method of claim 21, wherein the pH of the composition is within the range of about 6 to 7.

23. The method of claim 21, wherein the substrate is steel.

24. The method of claim 21, wherein the substrate is aluminum metal.

25. A composition for graft polymerizing a conductive, tenacious, and protective coating on a metallic substrate comprising:
(a) one or more polymerizable monomers having at least two functionalities;
(b) one or more graft initiators containing nickel ions in an amount effective to initiate the grafting of the monomers onto the substrate; and
(c) a reducing agent capable of reducing nickel ion to nickel metal.

26. The composition of claim 25, wherein the monomer is a vinyl monomer having functionalities selected from the group consisting of hydroxyl, carboxyl, epoxy, amide, and amine anhydride functional groups.

27. The composition of claim 25, wherein the monomer is selected from the group consisting of hydroxyethyl acrylate and hydroxypropyl acrylate.

28. The composition of claim 25, wherein the nickel ion is present as a salt selected from the group consisting of nickel sulfate hexahydrate, nickel acetate tetrahydrate, nickel chloride, and nickel sulfate.

29. The composition of claim 25, wherein the reducing agent contains phosphorous.

30. The composition of claim 29 wherein the reducing agent is sodium hypophosphite.

31. A composition for graft polymerizing a conductive, tenacious, and protective coating on a steel or aluminum metallic substrate comprising:
(a) one or more polymerizable monomers having at least two functionalities, the monomers being selected from the group consisting of hydroxyethyl acrylate and hydroxypropyl acrylate;
(b) one or more graft initiators containing nickel ion in an amount effective to initiate the graft polymerization of the monomers onto the substrate, the nickel ion being present as a salt selected from the group consisting of nickel sulfate hexahydrate, nickel acetate tetrahydrate, nickel chloride, and nickel sulfate; and
(c) a phosphorous containing reducing agent capable of reducing the nickel ion to nickel metal,
the nickel metal being present in a concentration effective to result in the coated metal substrate having a surface resistivity of less than 0.1 ohm per square.

32. The composition of claim 31, wherein the pH of the composition is within the range of about 6 to 7.

33. The composition of 31, wherein the nickel ion is present in the composition in the range of about 20 to about 35 parts by weight.

34. A metallic substrate coated with a conductive, tenacious, and protective coating comprising:
(a) a metallic substrate; and
(b) a conductive, tenacious, and protective coating graft polymerized bonded to the substrate, the coating comprising:
(i) one or more polymerized monomers having at least two functionalities; and
(ii) nickel metal;
the coated substrate having a surface resistivity of less than 0.1 ohm per square.

35. The coated substrate of claim 34, wherein the monomer is a vinyl monomer having functionalities selected from the group consisting of hydroxyl, carboxyl, epoxy, amide, and amine anhydride functional groups.

36. The coated substrate of claim 35, wherein the monomer is selected from the group consisting of hydroxyethyl acrylate and hydroxypropyl acrylate.

37. The coated substrate of claim 34, wherein the coating is about 5 to about 50 micrometers in thickness.

38. The coated substrate of claim 34, wherein the coating further comprises elemental phosphorous.

39. The coated substrate of claim 34, wherein the substrate metal is selected from the group consisting of steel, aluminum, iron, platinum, silver, nickel, gold, cobalt, copper, copper alloys, and combinations thereof.

40. The coated substrate of claim 34, wherein the substrate is selected from the group consisting of steel, aluminum, and combinations thereof.

41. A metallic substrate coated with a conductive, tenacious, and protective coating comprising:
(a) a metallic substrate selected from the group consisting of steel, aluminum, and combinations thereof;
(b) a conductive, tenacious, and protective coating graft bonded to the substrate, the coating comprising:
(i) one or more monomers selected from the group consisting of hydroxyethyl acrylate and hydroxypropyl acrylate; and
(ii) nickel metal;
the coated substrate having a surface resistivity of less than 0.1 ohm per square.

42. The coated substrate of claim 41, the coating further comprising elemental phosphorous.

* * * * *